(12) United States Patent
Rahman et al.

(10) Patent No.: US 11,404,630 B2
(45) Date of Patent: Aug. 2, 2022

(54) PERPENDICULAR SPIN TRANSFER TORQUE MEMORY (PSTTM) DEVICES WITH ENHANCED STABILITY AND METHOD TO FORM SAME

(71) Applicant: Intel Corporation, Santa Clara, CA (US)

(72) Inventors: Md Tofizur Rahman, Portland, OR (US); Christopher J. Wiegand, Portland, OR (US); Kaan Oguz, Beaverton, OR (US); Justin S. Brockman, Portland, OR (US); Daniel G. Ouellette, Portland, OR (US); Brian Maertz, Santa Barbara, CA (US); Kevin P. O'Brien, Portland, OR (US); Mark L. Doczy, Beaverton, OR (US); Brian S. Doyle, Portland, OR (US); Oleg Golonzka, Beaverton, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/463,821

(22) PCT Filed: Dec. 30, 2016

(86) PCT No.: PCT/US2016/069473
§ 371 (c)(1),
(2) Date: May 23, 2019

(87) PCT Pub. No.: WO2018/125204
PCT Pub. Date: Jul. 5, 2018

(65) Prior Publication Data
US 2019/0334079 A1 Oct. 31, 2019

(51) Int. Cl.
*G11C 11/16* (2006.01)
*H01L 43/02* (2006.01)
(Continued)

(52) U.S. Cl.
CPC ............ *H01L 43/02* (2013.01); *G11C 11/161* (2013.01); *H01L 43/10* (2013.01); *H01L 43/12* (2013.01)

(58) Field of Classification Search
CPC .......... H01L 43/02; H01L 43/08; H01L 43/10; G11C 11/161
See application file for complete search history.

(56) References Cited

U.S. PATENT DOCUMENTS 8,513,749 B2 * 8/2013 Chen ...................... H01L 43/08
257/421
9,231,191 B2 1/2016 Huang et al.
(Continued)

FOREIGN PATENT DOCUMENTS

EP 2705518 3/2014

OTHER PUBLICATIONS

International Search Report and Written Opinion for International Patent Application No. PCT/US2016/069473 dated Sep. 22, 2017, 13 pgs.
(Continued)

*Primary Examiner* — Sarah K Salerno
(74) *Attorney, Agent, or Firm* — Schwabe, Williamson & Wyatt, P.C.

(57) ABSTRACT

A material layer stack for a pSTTM memory device includes a magnetic tunnel junction (MTJ) stack, a oxide layer, a protective layer and a capping layer. The MTJ includes a fixed magnetic layer, a tunnel barrier disposed above the fixed magnetic layer and a free magnetic layer disposed on the tunnel barrier. The oxide layer, which enables an
(Continued)

increase in perpendicularity of the pSTTM material layer stack, is disposed on the free magnetic layer. The protective layer is disposed on the oxide layer, and acts as a protective barrier to the oxide from physical sputter damage during subsequent layer deposition. A conductive capping layer with a low oxygen affinity is disposed on the protective layer to reduce iron-oxygen de-hybridization at the interface between the free magnetic layer and the oxide layer. The inherent non-oxygen scavenging nature of the conductive capping layer enhances stability and reduces retention loss in pSTTM devices.

17 Claims, 4 Drawing Sheets

(51) Int. Cl.
    *H01L 43/10*     (2006.01)
    *H01L 43/12*     (2006.01)

(56) References Cited

U.S. PATENT DOCUMENTS

| | | | | |
|---|---|---|---|---|
| 9,337,415 | B1* | 5/2016 | Oh | H01L 43/08 |
| 9,425,387 | B1 | 8/2016 | Liu | |
| 2004/0017639 | A1* | 1/2004 | Deak | H01L 43/08 |
| | | | | 360/324.2 |
| 2007/0047153 | A1* | 3/2007 | Zeltser | G01R 33/093 |
| | | | | 360/324 |
| 2011/0062537 | A1* | 3/2011 | Oh | G11C 11/16 |
| | | | | 257/421 |
| 2011/0149647 | A1 | 6/2011 | Kim et al. | |
| 2011/0235217 | A1 | 9/2011 | Chen et al. | |
| 2013/0140658 | A1 | 6/2013 | Yamane | |
| 2013/0175644 | A1* | 7/2013 | Horng | G11C 11/161 |
| | | | | 257/421 |
| 2014/0077318 | A1* | 3/2014 | Kula | H01L 43/08 |
| | | | | 257/421 |
| 2014/0217532 | A1 | 8/2014 | Li et al. | |
| 2016/0155931 | A1 | 6/2016 | Lee et al. | |
| 2016/0204341 | A1 | 7/2016 | Gan | |
| 2016/0254445 | A1 | 9/2016 | Tahmasebi | |
| 2016/0284763 | A1 | 9/2016 | Tahmasebi | |
| 2019/0036010 | A1* | 1/2019 | Maertz | H01L 43/02 |
| 2019/0198567 | A1* | 6/2019 | Oguz | H01L 43/08 |

OTHER PUBLICATIONS

International Preliminary Report on Patentability for International Patent Application No. PCT/US2016/069473 dated Jul. 11, 2019, 13 pgs.

Search Report from European Patent Application No. EP 16925295.4 dated Jun. 3, 2020, 13 pgs.

Kanak J et al: "X-ray diffraction analysis and Monte Carlo simulations of CoFeB—Mg0 based magnetic tunnel junctions", Journal of Applied Physics, American Institute of Physics, US, vol. 113, No. 2, Jan. 14, 2013.

Tao B S et al: "Perpendicular magnetic anisotropy in Ta;Co40Fe40B20 | MgAl2O4structures and perpendicular CoFeB:MgAl2O4:CoFeB magnetic tunnel junction", Applied Physics Letters, A I P Publishing LLC, US, vol. 105, No. 10, Sep. 8, 2014.

* cited by examiner

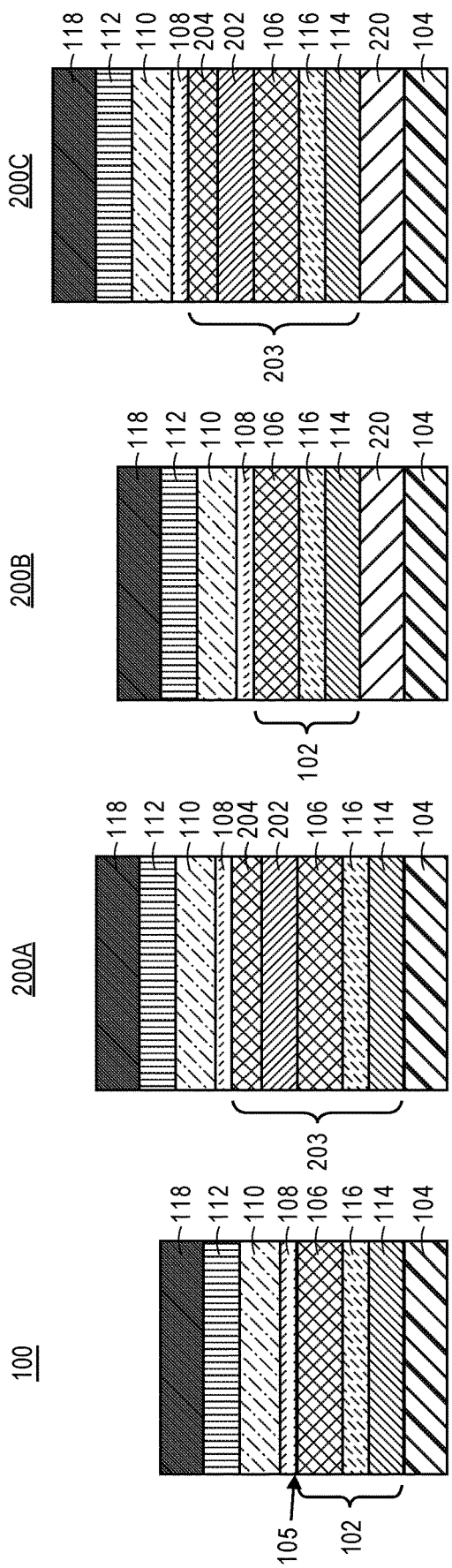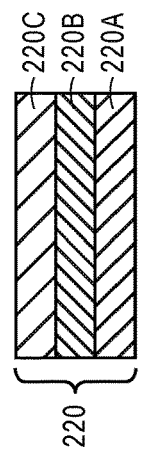

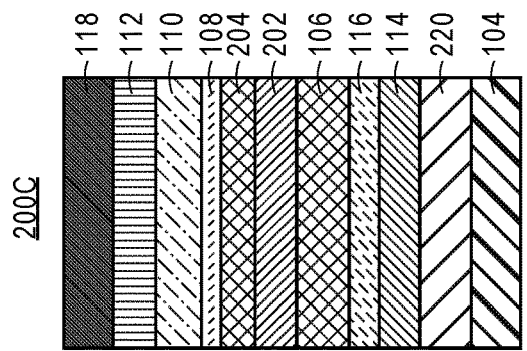
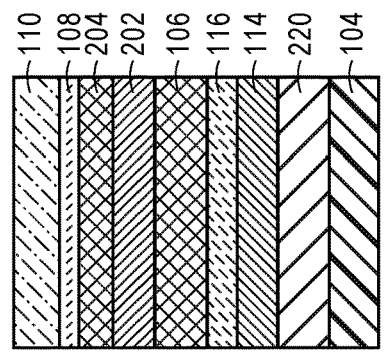
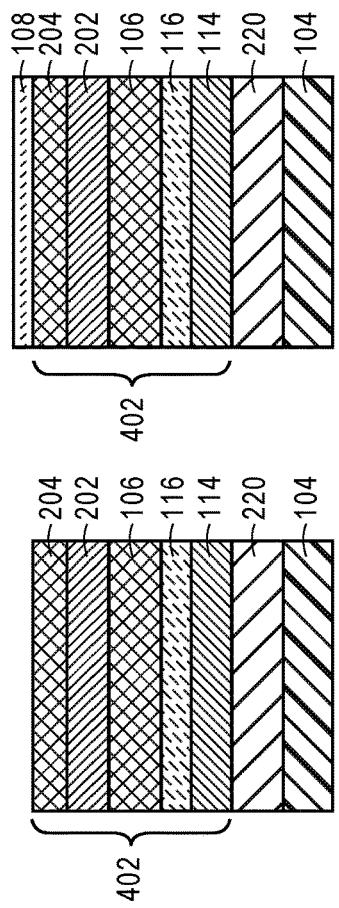
FIG. 4D
FIG. 4C
FIG. 4B
FIG. 4A

PERPENDICULAR SPIN TRANSFER TORQUE MEMORY (PSTTM) DEVICES WITH ENHANCED STABILITY AND METHOD TO FORM SAME

CROSS-REFERENCE TO RELATED APPLICATION

This patent application is a U.S. National Phase Application under 35 U.S.C. § 371 of International Application No. PCT/US2016/069473, filed Dec. 30, 2016, entitled "PERPENDICULAR SPIN TRANSFER TORQUE MEMORY (PSTTM) DEVICES WITH ENHANCED STABILITY AND METHOD TO FORM SAME," which designates the United States of America, the entire disclosure of which is hereby incorporated by reference in its entirety and for all purposes.

TECHNICAL FIELD

Embodiments of the invention are in the field of integrated circuit fabrication and, in particular, perpendicular spin transfer torque memory (pSTTM) devices with enhanced stability and method to form same.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely heavily on innovative fabrication techniques to meet the exceedingly tight tolerance requirements imposed by scaling.

Non-volatile embedded memory with pSTTM devices, e.g., on-chip embedded memory with non-volatility can enable energy and computational efficiency. However, the technical challenges of assembling a pSTTM stack to form functional devices present formidable roadblocks to commercialization of this technology today. Specifically, increasing thermal stability and reducing retention loss of pSTTM devices are some important areas of process development.

As such, significant improvements are still needed in the areas of pSTTM stack development.

BRIEF DESCRIPTION OF THE DRAWINGS

FIG. 1 illustrates a cross-sectional view of a material layer stack for a perpendicular STTM device, in accordance with an embodiment of the present invention.

FIGS. 2A-2C illustrate cross-sectional views of various material layer stacks for fabrication of perpendicular STTM devices, where additional layers are inserted into the material layer stack to improve magnetic properties.

FIG. 2A illustrates a cross-sectional view of a material layer stack for a perpendicular STTM device, in accordance with an embodiment of the present invention.

FIG. 2B illustrates a cross-sectional view of a material layer stack for a perpendicular STTM device, in accordance with an embodiment of the present invention.

FIG. 2C illustrates a cross-sectional view of a material layer stack for a perpendicular STTM device, in accordance with an embodiment of the present invention.

FIG. 3 illustrates a cross-sectional view of individual layers of a synthetic antiferromagnetic layer.

FIG. 4A-4D illustrate cross-sectional views representing various operations in a method of fabricating a pSTTM material layer stack.

FIG. 4A illustrates a cross-sectional view of the formation of a magnetic tunnel junction formed on a bottom electrode layer.

FIG. 4B illustrates a cross-sectional view of the formation of a oxide on the magnetic tunnel junction.

FIG. 4C illustrates a cross-sectional view of the formation of a protective layer on the oxide.

FIG. 4D illustrates a cross-sectional view of the formation of a capping layer on the protective layer and the formation of a top electrode on the capping layer.

DESCRIPTION OF THE EMBODIMENTS

Figure 5:
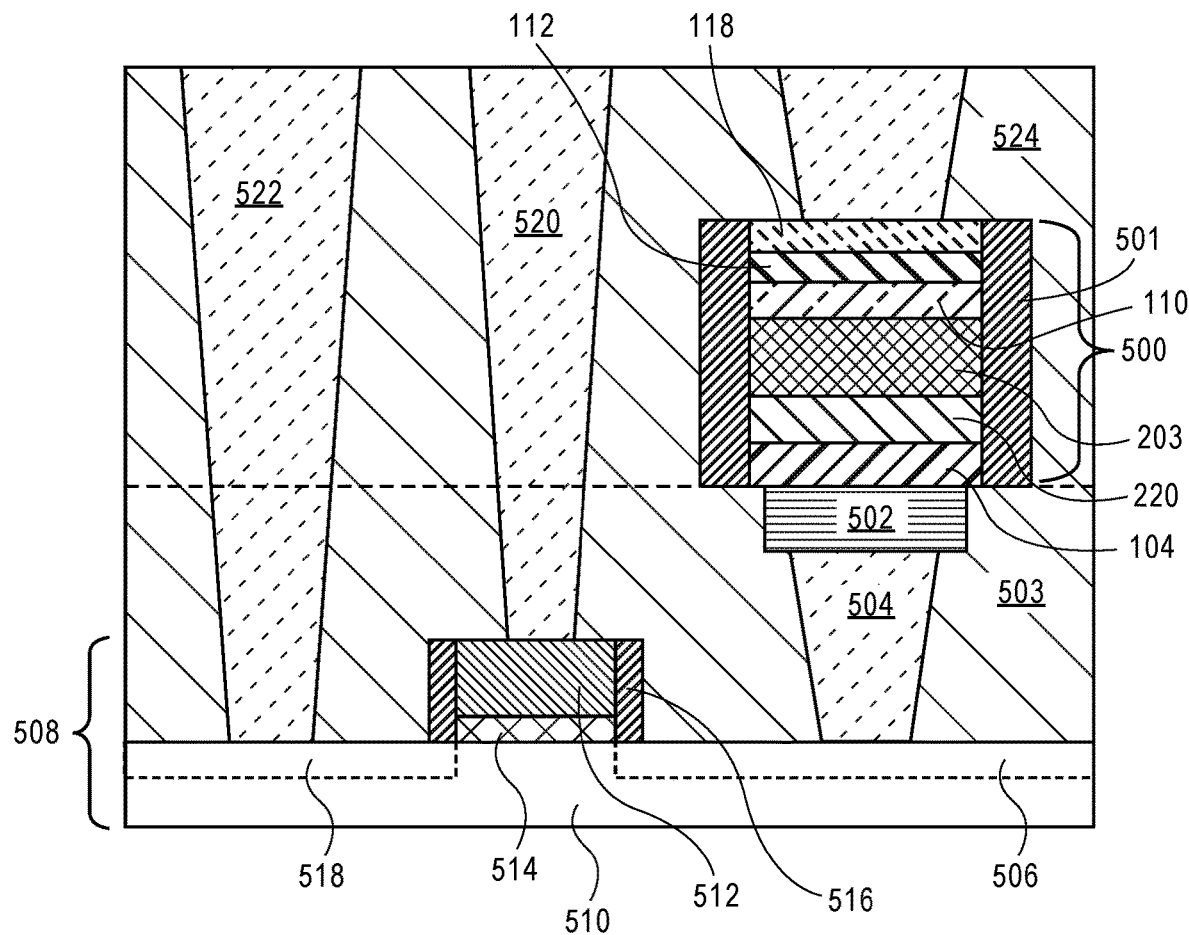
FIG. 5 illustrates a cross-sectional view of a pSTTM device formed on a conductive interconnect coupled to a transistor.

Perpendicular-spin transfer torque memory (pSTTM) devices with enhanced stability and methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as transistor operations and switching operations associated with embedded memory, are described in lesser detail in order to not unnecessarily obscure embodiments of the present invention. Furthermore, it is to be understood that the various embodiments shown in the Figures are illustrative representations and are not necessarily drawn to scale.

A pSTTM device functions as a variable resistor where the resistance of the device may switch between a high resistance state and a low resistance state. The resistance state of a pSTTM device is defined by the relative orientation of magnetization of two magnetic layers (fixed and free) that are separated by a tunnel barrier. When the magnetization of the two magnetic layers have orientations that are in the same direction the pSTTM device is said to be in a low resistance state. Conversely, when the magnetization of the two magnetic layers have orientations that in opposite directions the pSTTM device is said to be in a high resistance state. In an embodiment, the resistance switching is brought about by passing a critical amount of spin polarized current through the pSTTM so as to influence the orientation of the magnetization of the free magnetic layer to align with the magnetization of the fixed magnetic layer. By changing the direction of the current, the magnetization in the free magnetic layer may be reversed relative to that of the fixed magnetic layer. Since the free magnetic layer does not need power to retain relative orientation of magnetization, the resistance state of the pSTTM device is retained even when there is no power applied to the pSTTM device. For this reason, pSTTM belongs to a class of memory known as non-volatile memory.

Integrating a non-volatile memory devices such as a STTM device onto an access transistor enables the formation of embedded memory for system on chip or for other applications. However, approaches to integrate an STTM device onto an access transistor presents challenges that have become far more formidable with scaling. Examples of such challenges range from improving thermal stability of STTM devices against perturbing forces, reducing retention loss and enabling patterning of STTM devices at less than 40 nm feature sizes. As scaling continues, the need for smaller memory devices to fit into a scaled cell size has driven the industry in the direction of "perpendicular" STTM or pSTTM. Fortunately, while pSTTM devices have higher stability for small memory device sizes, maintaining stability along with improving other device parameters continues to be a challenge.

As the pSTTM device typically includes a multilayer stack of magnetic and non-magnetic materials, the stack is engineered to possess a perpendicular anisotropy. Perpendicular anisotropy, in turn, depends on tuning properties of magnetic and non-magnetic interfaces. Hence, controlling the degree of stability of perpendicularity in such pSTTM devices is in part dictated by the ability to maintain the desired interfacial properties which give rise to perpendicularity in the first place.

A simplest embodiment of a pSTTM device includes a fixed or reference magnetic layer, a tunnel barrier disposed on the fixed magnetic layer and a free magnetic layer, including iron disposed on the tunnel barrier. In an embodiment, an addition of a oxide above the free magnetic layer is found to improve the perpendicularity anisotropy by preserving the interfacial perpendicular anisotropy at the interface between the oxide layer and the free magnetic layer. Moreover, retention in perpendicular STTM devices is also found to be improved by incorporating the oxide layer above the free magnetic layer. The interfacial perpendicular anisotropy arises due to bond hybridization between iron in the free magnetic layer and oxygen in the tunnel barrier at the bottom of the free layer and between iron in the free magnetic layer and oxygen in the oxide layer on top of the free layer. However, oxygen scavenging effects due to the presence of layers above the oxide can lead to degradation in interfacial perpendicular anisotropy. Preservation of iron-oxygen hybridization at the interface is enabled by inserting non-oxygen scavenging layers above the oxide layer.

In accordance with embodiments of the present invention, a material layer stack for a pSTTM memory device includes a magnetic tunnel junction (MTJ) stack, an oxide layer, a protective layer and a capping layer. In an embodiment, the MTJ includes a fixed magnetic layer, a tunnel barrier disposed above the fixed magnetic layer and a free magnetic layer disposed on the tunnel barrier. The oxide layer, which enables an increase in perpendicularity of the pSTTM material layer stack, is disposed on the free magnetic layer. The protective layer is disposed on the oxide layer, and acts as a protective barrier for the oxide against physical sputter damage during subsequent layer deposition used in the fabrication of a pSTTM device. A conductive capping layer, which is non-oxygen scavenging, is disposed on the protective layer to improve iron-oxygen hybridization at the interface between the free magnetic layer and the oxide layer. The inherent non-oxygen scavenging nature of the conductive capping layer enhances stability and reduces retention loss in pSTTM devices.

FIG. 1 illustrates a cross-sectional illustration of a material layer stack 100 for a pSTTM device in accordance with an embodiment of the present invention. The material layer stack 100 includes an MTJ stack 102 disposed on a bottom electrode layer 104. The MTJ stack 102 has a free magnetic layer 106 which includes iron. The material layer stack 100 further includes an oxide layer 108 disposed on the free magnetic layer 106 of the MTJ stack 102. In an embodiment, the oxide layer 108 includes an MgO. In an embodiment, the oxide layer 108 has a thickness that is between 0.3 nm-1.5 nm. The oxide provides a source of oxygen that enables oxygen-iron hybridization at an interface 105 located between an uppermost surface of the free magnetic layer 106 and a lowermost surface of the oxide layer 108. The oxygen-iron hybridization in the interface 105 enables interfacial perpendicular anisotropy in the free magnetic layer 106. Preservation of perpendicular anisotropy results relies upon successfully keeping away oxygen gettering elements from reaching the interface 105 through processes such as diffusion.

Referring again to FIG. 1, a protective layer 110 is disposed on the oxide layer 108. The protective layer 110 acts as a protective barrier for the oxide layer 108 against direct physical sputter damage during the formation of a subsequent layer such as a conductive capping layer 112. In an embodiment, the protective layer 110 is an alloy whose individual constituent atoms each have a lower atomic mass compared to the atomic mass of the materials included in the conductive capping layer 112. In an embodiment, the protective layer 110 has a thickness between 0.3 nm-1.5 nm. In an embodiment, the protective layer 110 has a stoichiometry of the cobalt and the iron in the film and a thickness to make the CoFeB non-magnetic and additionally, a thickness sufficient to prevent sputter damage the deposition of the conductive capping layer 112.

Referring again to FIG. 1, a conductive capping layer 112 is disposed on the protective layer 110. In an embodiment, the conductive capping layer 112 includes a metal having a low oxygen affinity. Because atoms from the conductive capping layer 112 can diffuse through the protective layer 110 and react with the oxygen (oxidation) in the interface 105, a metal with a low oxygen affinity is utilized to form a conductive capping layer 112. The iron-oxygen hybridization in interface 105 is not appreciably altered by the presence of diffused atoms from a low oxygen affinity metal. Thus, by maintaining the iron-oxygen hybridization, interfacial anisotropy can be preserved.

In an embodiment, the conductive capping layer 112 includes a metal such as, but not limited to, osmium, rhodium, molybdenum, ruthenium, tungsten, iridium, gold, palladium or platinum. In an embodiment, the conductive capping layer 112 is molybdenum. In an embodiment the conductive capping layer 112 includes a metal that has an oxygen affinity less than the oxygen affinity of tantalum. In an embodiment, the conductive capping layer 112 has a thickness that is between 1.5 nm-6 nm. A thickness of 1.5 nm-6 nm does not appreciably increase the resistivity of the material layer stack 100. In an embodiment, the conductive capping layer 112 includes a bilayer stack. The bilayer stack includes a first conductive capping layer that is in direct contact with the protective layer 110 and a second conductive capping layer disposed on the first conductive capping layer. In an embodiment, the first conductive capping layer of the bilayer stack is a metal having a low oxygen affinity and the second conductive capping layer can include a metal with a higher oxygen affinity than the oxygen affinity of the first conductive capping layer. In one such embodiment, the first conductive capping layer has a thickness between 3 nm-6 nm and the second conductive capping layer has a thickness that is between 3 nm-6 nm. In an embodiment, the MTJ stack 102 further includes a fixed magnetic layer 114 that is disposed on the bottom electrode layer 104. A tunnel barrier 116 is disposed on the fixed magnetic layer 114 and the free magnetic layer 106 is disposed on the tunnel barrier 116. The fixed magnetic layer 114 and the free magnetic layer 106 have perpendicular magnetic anisotropy. The MTJ stack 102 is in a high resistance state when direction of magnetization in the free magnetic layer 106 is opposite (anti-parallel) to the direction of magnetization in the fixed magnetic layer 114. Conversely, the MTJ stack 102 is in a low resistance state when the direction of magnetization in the free magnetic layer 106 is parallel to the direction of magnetization in the fixed magnetic layer 114. A change in resistance (high to low or low to high) in the MTJ stack 102 results when a spin polarized electron current passing from the fixed magnetic layer 114 through the tunnel barrier 116 brings about a change in the direction of the magnetization in the free magnetic layer 106.

In an embodiment, the free layer 116 of the MTJ stack 102 includes an alloy such as CoFe and CoFeB. In an embodiment the free layer 116 is CoFeB. In an embodiment, the free layer 116 has a thickness between 1 nm-2.5 nm. In an embodiment, a CoFeB free magnetic layer 106 having a thickness less than 2.5 nm exhibits a perpendicular anisotropy. Moreover, the interfacial perpendicular anisotropy arising from iron-oxygen hybridization in the interface 105 aids in maintaining the perpendicularity of the free magnetic layer 106.

In an embodiment, the tunnel barrier 116 is composed of a material suitable for allowing electron current having a majority spin to pass through the tunnel barrier 116, while impeding at least to some extent electron current having a minority spin from passing through the tunnel barrier 116. Thus, the tunnel barrier 116 (or spin filter layer) may also be referred to as a tunneling layer for electron current of a particular spin orientation. In one embodiment, the tunnel barrier 116 includes a material such as, but not limited to, magnesium oxide (MgO) or aluminum oxide ($Al_2O_3$). In one embodiment, the tunnel barrier 116 is MgO and has a thickness of approximately 1 to 2 nm.

In an embodiment, the fixed magnetic layer 114 is composed of materials and has a thickness suitable for maintaining a fixed magnetization. In one embodiment, the fixed magnetic layer 114 is composed of a single layer of cobalt iron boron (CoFeB). In an embodiment the fixed magnetic layer 114 has a thickness that is between 2-3 nm.

In an embodiment, the bottom electrode layer 104 is composed of a material or stack of materials suitable for electrically contacting the fixed magnetic layer 114 side of the material layer stack 100. In an embodiment, the bottom electrode layer 104 is a topographically smooth electrode. In a specific embodiment, the bottom electrode layer 104 is composed of Ru layers interleaved with Ta layers. In another embodiment, the bottom electrode layer 104 is TiN. In an embodiment, the bottom electrode layer 104 has a thickness between 20 nm-50 nm.

In an embodiment, the top electrode layer 118 includes a material such as Ta or TiN. In an embodiment, the top electrode layer 118 includes a material suitable to provide a hardmask for etching the material layer stack 100 to form pSTTM devices. In an embodiment, top electrode layer 118 includes a material that can act as a contact electrode. In an embodiment, the top electrode layer 118 has a thickness between 30-70 nm. In an embodiment, the top electrode and the bottom electrode include a same metal such as Ta or TiN.

FIGS. 2A-2C illustrate cross-sectional views of various material layer stacks for fabrication of perpendicular STTM devices, where additional layers are inserted into the material layer stack 100 to improve magnetic properties.

FIG. 2A illustrates a cross sectional view of the material layer stack 200A in which (a) a coupling layer 202 is disposed on the free magnetic layer 106 and (b) a second free magnetic layer 204 is disposed on the coupling layer 202. Insertion of both the coupling layer 202 and the second free magnetic layer 204 increase the number of interfaces between an uppermost surface of the tunnel barrier 116 and a lower most surface of the oxide 108 from 1 to 4, providing an increase in the overall interfacial perpendicular anisotropy in the MTJ stack 203.

In an embodiment, the free magnetic layer 106 and the second free magnetic layer 204 include a CoFeB layer. In an embodiment, when the free magnetic layer 106 and the second free magnetic layer 204 include a CoFeB layer, the first free magnetic layer 106 has a thickness greater than the thickness of the second free magnetic layer 204. In an embodiment the CoFeB free magnetic layer 106 has a thickness between 0.5 nm-2 nm and the second CoFeB free magnetic layer 204 has a thickness between 0.3 nm-1.5 nm. In an embodiment, the coupling layer 202 includes a transition metal such as, but not limited to, tungsten, molybodenum, vanadium, niobium iridium. In an embodiment, the coupling layer 202 has a thickness between 0.1 nm-1 nm.

FIG. 2B illustrates a cross-sectional illustration of a material layer stack 200B in which a synthetic antiferromagnetic (SAF) layer 220 is disposed between the bottom electrode layer 104 and the fixed magnetic layer 114. In an embodiment, the free magnetic layer 106 and the fixed magnetic layer 114 can have similar thicknesses and an injected electron spin current which changes the orientation of the magnetization in the free magnetic layer 106 can also affect the magnetization of the fixed magnetic layer 114. In an embodiment, to make the fixed magnetic layer more resistant to accidental flipping the thickness of the fixed magnetic layer can be increased. In another embodiment, a synthetic antiferromagnetic (SAF) layer 220 in contact with the fixed magnetic layer 114, as is illustrated in the cross-sectional illustration of FIG. 2B can also enable accidental flipping of the fixed magnetic layer 114. In an embodiment, the SAF layer 220 includes a non-magnetic layer 220B sandwiched between a first magnetic layer 220A and a second magnetic layer and 220C as depicted in FIG. 3. In an embodiment, the first magnetic layer 220A includes a metal such, but limited to, Co, Ni/Pt, Pd, a non-magnetic layer 220B that is ruthenium and a second magnetic layer 220C that is Co, Ni/Pt, Pd Multilayers CoFeB. In an embodiment, a ruthenium based non-magnetic layer 220B is limited to a thickness range of 4-9 Angstroms to ensure that the coupling between the first magnetic layer 220A and the second magnetic layer and 220C is anti-ferromagnetic in nature FIG. 2C illustrates a cross-sectional view of a material layer stack 200C which includes (a) the coupling layer 202 and the second free magnetic layer 204 and (b) the SAF layer 220 to improve perpendicular anisotropy in the material layer stack 200C and improve stability in the fixed magnetic layer 114, respectively.

FIG. 4A-4D illustrate cross-sectional views representing various operations in a method of fabricating the pSTTM material layer stack 200C depicted in FIG. 2C.

FIG. 4A illustrates a cross-sectional view of the formation of a magnetic tunnel junction (MTJ) stack 402 and a SAF layer 220 formed on a bottom electrode 104. In an embodiment, the bottom electrode is deposited on a substrate. In an embodiment, the SAF layer 220 is deposited on an uppermost surface of the bottom electrode 104. In an embodiment, the various layers in the MTJ stack 402 (depicted in FIG. 4A) are sequentially blanket deposited onto the SAF layer 220 by deposition methods that are well known in the art. In an embodiment, MTJ stack 402 includes the fixed magnetic layer 114, the tunnel barrier 116, the free magnetic layer 106, the coupling layer 202 and the second free layer 204. In an embodiment, the process utilized to deposit the bottom electrode layer 104, the SAF layer 220 and the MTJ stack 402 is carried out with no air break. In another embodiment, the bottom electrode layer 104 is first blanket deposited and planarized. The SAF layer 220 and the remaining layers of the MTJ stack 402 are then blanket deposited onto the planarized bottom electrode 104.

FIG. 4B illustrates a cross-sectional view of the formation of an oxide layer 108 on an uppermost surface of the MTJ stack 402. In an embodiment, the oxide layer 108 is deposited using a reactive sputter deposition technique and includes a material such as MgO. In an embodiment, the oxide layer 108 has a thick between 0.3 nm-1.5 nm. In an embodiment, when the oxide layer 108 is the same material as the tunnel barrier 116, such as MgO, the MgO oxide layer 108 has a thickness that is less than the thickness of the tunnel barrier 116.

FIG. 4C illustrates a cross-sectional view of the formation of a protective layer 110 on the oxide layer 108. In an embodiment, the protective layer 110 is blanket deposited on the uppermost surface of the oxide layer 108 using a sputter deposition process. The protective layer 110 includes a material such as CoFeB.

In an embodiment, the protective layer 110 has a thickness sufficient to withstand against sputter damage during subsequent deposition of the conductive capping layer 112. In an embodiment, the cobalt composition is tuned to a level below 25% relative to the Iron composition, in the CoFeB alloy. In one such embodiment, the resulting $Co_xFe_{1-x}B$ protective layer 110 (where x<0.25) having a thickness of 0.3 to 1.5 nm is a magnetically-dead layer.

FIG. 4D illustrates a cross-sectional view of the formation of a conductive capping layer 112 on the protective layer 110 followed by the formation of a top electrode layer 118 on the conductive capping layer 112.

In an embodiment, the conductive capping layer 112 includes a metal such as molybdenum or ruthenium. Metals with a lack of oxygen affinity such as molybdenum and ruthenium provide protection against oxygen scavenging from the interface 105. In an embodiment, the conductive capping layer 112 is blanket deposited onto the surface of the protective layer 110, using a low energy physical vapor deposition (PVD) process. In an embodiment, the conductive capping layer 112 is deposited to a thickness of 1.5 nm-5 nm. A conductive capping layer 112 having a thickness of 1.5-5 nm provides a barrier against out-diffusion of oxygen from the oxide to the protective layer.

In an embodiment, the top electrode layer 118 is blanket deposited on the surface of the conductive capping layer 112. In an embodiment, the top electrode layer includes a material such as Ta. In an embodiment, the thickness of the top electrode layer ranges from 30-70 nm.

Magnetic measurements of coercivity, TMR, stability and retention may be measured after the material layer stack 200C has been formed. In an embodiment, the coercivity measurements of material layer stack 200C reveals that implementing a conductive capping layer 112 including materials such as Mo/Ru or Ru increases the coercivity of the material layer stack 200C by almost 35-50% over the use of an oxygen scavenging material such as Ta as a conductive capping layer 112.

In an embodiment, thermal stability measurements of pSTTM devices having a device size of 40 nm, fabricated with the material layer stack 200C, exhibit thermal stability between 55-70 kT. In an embodiment, the use of a non-oxygen scavenging material such as a conductive capping layer 112 enables an improvement of 15-25% in thermal stability over the use of a Ta based conductive capping layer 112. Measurements of retention loss may be measured in pSTTM devices fabricated with the material layer stack 200C. Retention loss is measured in pSTTM devices when the devices are in high resistance state and when the devices are in low resistance state. In an embodiment, the use of a non-oxygen scavenging material for conductive capping layer 112 over the use of oxygen scavenging material exhibits retention loss of less than 12% for pSTTM devices in high resistance state and retention loss of nearly 0% for pSTTM devices in the low resistance state.

FIG. 5 illustrates a pSTTM memory device 500, formed on a conductive interconnect 502. In an embodiment, the conductive interconnect is disposed on a contact structure 504 above a drain region 506 of an access transistor 508 disposed above a substrate 510. In an embodiment, the material layer stack 200C described in FIG. 5 is blanket deposited on a conductive interconnect 502, lithographically patterned and then etched to form a pSTTM memory device 500 as is illustrated in FIG. 5. In an embodiment, the pSTTM memory device 500 is surrounded by a dielectric spacer layer 501. In an embodiment, the pSTTM memory device 500 has a width that is greater than the width of the conductive interconnect 502. In one such embodiment, a portion of the bottom electrode 104 of pSTTM memory device 500 is also disposed on a dielectric layer 503. In an embodiment, the pSTTM memory device 500 has a width smaller than the width of the conductive interconnect 502. In an embodiment, the pSTTM memory device 500 has a width equal to the width of the conductive interconnect 502.

In an embodiment, the underlying substrate 510 represents a surface used to manufacture integrated circuits. Suitable substrate 510 includes a material such as single crystal silicon, polycrystalline silicon and silicon on insulator (SOI), as well as similar substrates formed of other semiconductor materials. The substrate 510 may also include semiconductor materials, metals, dielectrics, dopants, and other materials commonly found in semiconductor substrates.

In an embodiment, the access transistor 508 associated with substrate 510 are metal-oxide-semiconductor field-effect transistors (MOSFET or simply MOS transistors), fabricated on the substrate 510. In various implementations of the invention, the access transistor 508 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 508 of substrate 510 includes a gate stack formed of at least two layers, a gate dielectric layer 514 and a gate electrode layer 512. The gate dielectric layer 514 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 514 to improve its quality when a high-k material is used.

The gate electrode layer 512 of the access transistor 508 of substrate 510 is formed on the gate dielectric layer 514 and may consist of at least one P-type workfunction metal or N-type workfunction metal, depending on whether the transistor is to be a PMOS or an NMOS transistor. In some implementations, the gate electrode layer 512 may consist of a stack of two or more metal layers, where one or more metal layers are workfunction metal layers and at least one metal layer is a conductive fill layer.

For a PMOS transistor, metals that may be used for the gate electrode layer 512 include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 512 may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 512 may consist of one or more U-shaped metal layers formed atop one or more planar, non-U-shaped layers.

In some implementations of the invention, a pair of sidewall spacers 516 may be formed on opposing sides of the gate stack that bracket the gate stack. The sidewall spacers 516 may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source region 518 and drain region 506 are formed within the substrate adjacent to the gate stack of each MOS transistor. The source region 518 and drain region 506 are generally formed using either an implantation/diffusion process or an etching/deposition process. In the former process, dopants such as boron, aluminum, antimony, phosphorous, or arsenic may be ion-implanted into the substrate to form the source region 518 and drain region 506. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 518 and drain region 506. In some implementations, the source region 518 and drain region 506 may be fabricated using a silicon alloy such as silicon germanium or silicon carbide. In some implementations the epitaxially deposited silicon alloy may be doped in situ with dopants such as boron, arsenic, or phosphorous. In further embodiments, the source region 518 and drain region 506 may be formed using one or more alternate semiconductor materials such as germanium or a group III-V material or alloy. And in further embodiments, one or more layers of metal and/or metal alloys may be used to form the source region 518 and drain region 506.

In an embodiment, a gate contact 520 and a source contact 522 are formed in a second dielectric layer 524 and in the dielectric layer 503 above the gate electrode 512 and source region 518, respectively.

Figure 6:
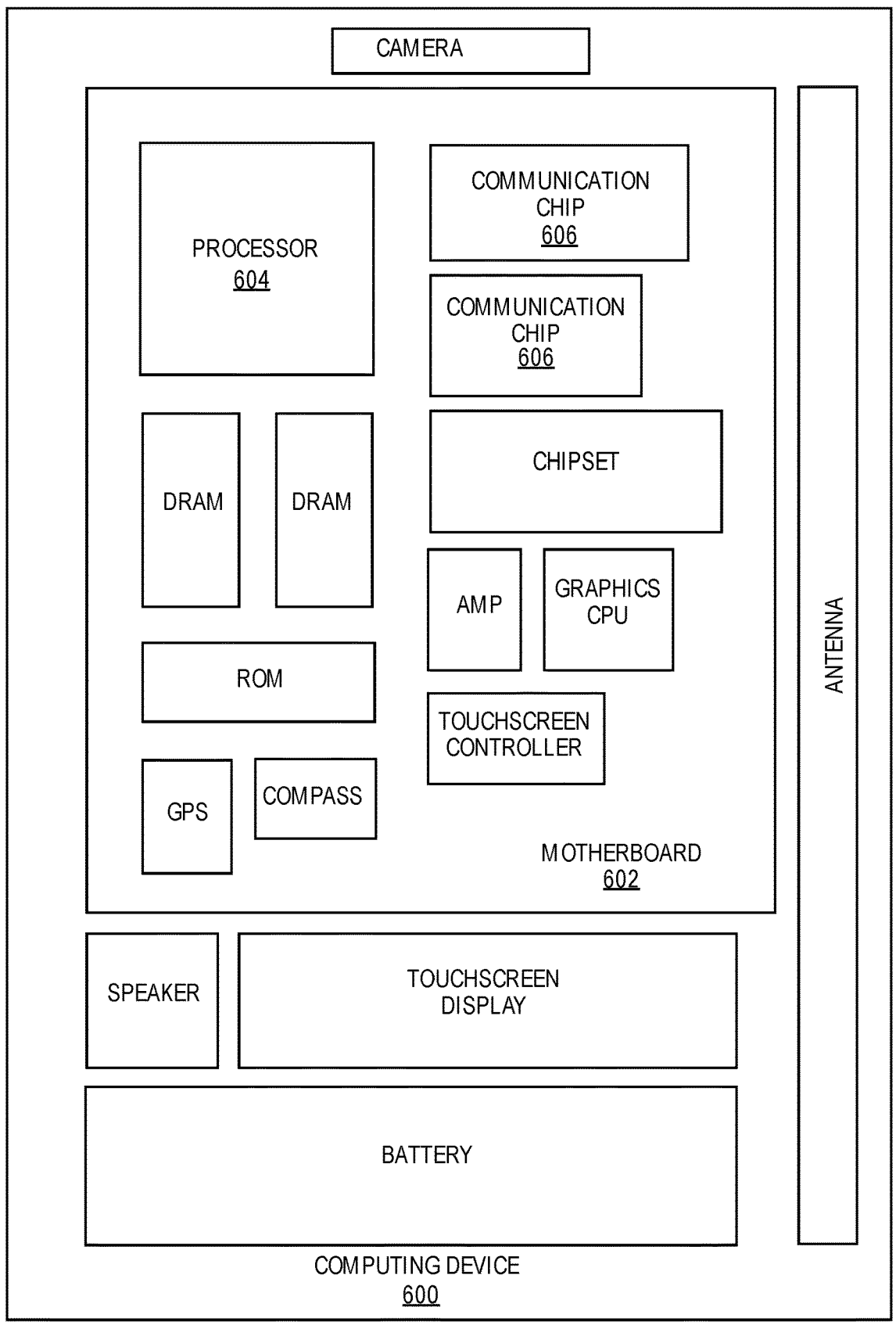
FIG. 6 illustrates a computing device in accordance with embodiments of the present invention.

FIG. 6 illustrates a computing device 600 in accordance with one embodiment of the invention. The computing device 600 houses a motherboard 602. The motherboard 602 may include a number of components, including but not limited to a processor 604 and at least one communication chip 606. The processor 604 is physically and electrically coupled to the motherboard 602. In some implementations the at least one communication chip 606 is also physically and electrically coupled to the motherboard 602. In further implementations, the communication chip 606 is part of the processor 604.

Depending on its applications, computing device 600 may include other components that may or may not be physically and electrically coupled to the motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of embodiments of the invention, the integrated circuit die of the processor includes one or more memory devices, such as a pSTTM memory device 500, built with a pSTTM material layer stack 200C in accordance with embodiments of the present invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of an embodiment of the invention, the integrated circuit die of the communication chip includes pSTTM memory elements integrated with access transistors, built in accordance with embodiments of the present invention.

In further implementations, another component housed within the computing device 600 may contain a stand-alone integrated circuit memory die that includes one or more memory elements, built in accordance with embodiments of the present invention.

In various implementations, the computing device 600 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Accordingly, one or more embodiments of the present invention relate generally to the fabrication of embedded microelectronic memory. The microelectronic memory may be non-volatile, wherein the memory can retain stored information even when not powered. One or more embodiments of the present invention relate to the fabrication of a pSTTM material layer stack 200C. Such pSTTM material layer stack 200C may be used in an embedded non-volatile memory application.

Thus, embodiments of the present invention include perpendicular-STTM (pSTTM) devices with enhanced stability and method to form same.

Example 1

A material layer stack for a pSTTM device includes a magnetic tunnel junction (MTJ) including a fixed magnetic layer. A tunnel barrier is disposed above the fixed magnetic layer and a free magnetic layer is disposed on the tunnel barrier. An oxide layer is disposed on the free magnetic layer. A protective layer is disposed on the oxide layer. A conductive capping layer is disposed directly on the protective layer, the conductive capping layer having a low oxygen affinity.

Example 2

The material layer stack of example 1, wherein the conductive capping layer is selected from the group consisting of molybdenum and ruthenium.

Example 3

The material layer stack of example 1 or 2, wherein the conductive capping layer includes a metal that has an oxygen affinity that is less than the oxygen affinity of tantalum.

Example 4

The material layer stack of example 1 or 3, wherein the conductive capping layer is selected from a highly siderophile group of elements consisting of osmium, iridium, platinum, rhenium and gold.

Example 5

The material layer stack of example 1, 2, 3 or 4, wherein the conductive capping layer has a thickness between 1.5 nm-5.0 nm.

Example 6

The material layer stack of example 1, wherein the protective layer includes cobalt and iron.

Example 7

The material layer stack of example 1 or 6, wherein the protective layer further includes boron.

Example 8

The material layer stack of example 1, 6 or 7, wherein the protective layer has a thickness between 0.3 nm-1.5 nm.

Example 9

The material layer stack of example 1, wherein the protective layer is not magnetic.

Example 10

The material layer stack of example 1, wherein the oxide layer is approximately 10-1000 times more conductive than the tunnel barrier.

Example 11

The material layer stack of example 1, wherein the oxide layer has a thickness between 0.3 nm-1.5 nm.

Example 12

A material layer stack for a pSTTM device includes a magnetic tunnel junction. The MTJ includes a fixed magnetic layer. A tunnel barrier is disposed above the fixed magnetic layer. A first free magnetic layer is disposed on the tunnel barrier. A coupling layer is disposed above the first free magnetic layer. A second free magnetic layer is disposed on the coupling layer. A oxide layer is disposed on the second free magnetic layer. A protective layer is disposed on the oxide layer. A conductive capping layer disposed directly on the protective layer, the conductive capping layer having a low oxygen affinity. A bottom electrode layer is disposed below the MTJ. A top electrode layer is disposed above the capping layer.

Example 13

The material layer stack of example 12, wherein the conductive capping layer is selected from the group consisting of molybdenum, ruthenium.

Example 14

The material layer stack of example 12 or 13, wherein the conductive capping layer has a thickness between 1.5 nm-5.0 nm.

Example 15

The material layer stack of example 12, wherein the protective layer includes cobalt, boron and iron.

Example 16

The material layer stack of example 12 or 15, wherein the protective layer has a thickness between 0.3 nm-1.5 nm.

Example 17

The material layer stack of example 12, wherein the oxide layer has a thickness that is less than the thickness of the tunnel barrier.

Example 18

The material layer stack of example 12, wherein the top electrode is a material different from the material of the capping layer

Example 19

The material layer stack of example 12, wherein a synthetic antiferromagnetic layer is disposed between the fixed layer and the bottom electrode layer.

Example 20

A method for fabricating a material layer stack for a non-volatile memory device, includes forming a bottom electrode layer. The method includes forming a magnetic tunnel junction (MTJ) above the bottom electrode. The method further includes forming a fixed magnetic layer and forming a tunnel barrier on fixed magnetic layer. The method includes forming a storage layer above the tunnel barrier and forming a oxide layer on the coupling layer. The method includes forming a protective layer on the oxide layer and forming a conductive capping layer on the protective layer. The method further includes forming a top electrode layer on the conductive capping layer.

Example 21

The method of example 20, wherein forming the protective layer includes depositing with materials that have a mass number less than the mass number of the capping layer.

Example 22

The method of example 20, wherein forming the capping layer includes depositing with a material that has an oxygen affinity of less than the oxygen affinity of tantalum.

Example 23

The method of example 20 or 22, wherein forming the capping layer includes intermixing between materials between materials comprising the capping layer and the materials comprising the protective layer.

What is claimed is:

1. A material layer stack for a pSTTM device, the material layer stack comprising:
   a magnetic tunnel junction (MTJ) including a fixed magnetic layer, a tunnel barrier disposed above the fixed magnetic layer and a free magnetic layer disposed on the tunnel barrier;
   an oxide layer disposed on the free magnetic layer;
   a non-magnetic protective layer disposed directly on the oxide layer, wherein the non-magnetic protective layer comprises cobalt and iron; and
   a conductive capping layer disposed directly on the non-magnetic protective layer, the conductive capping layer having a low oxygen affinity, wherein the conductive capping layer is not in contact with the oxide layer.

2. The material layer stack of claim 1, wherein the conductive capping layer is selected from the group consisting of molybdenum and ruthenium.

3. The material layer stack of claim 1, wherein the conductive capping layer includes a metal that has an oxygen affinity that is less than the oxygen affinity of tantalum.

4. The material layer stack of claim 1, wherein the conductive capping layer is selected from a highly siderophile group of elements consisting of osmium, iridium, platinum, rhenium and gold.

5. The material layer stack of claim 1, wherein the conductive capping layer has a thickness between 1.5 nm-5.0 nm.

6. The material layer stack of claim 1, wherein the non-magnetic protective layer further comprises boron.

7. The material layer stack of claim 1, wherein the non-magnetic protective layer has a thickness between 0.3 nm-1.5 nm.

8. The material layer stack of claim 1, wherein the oxide layer is approximately 10-1000 times more conductive than the tunnel barrier.

9. The material layer stack of claim 1, wherein the oxide layer has a thickness between 0.3 nm-1.5 nm.

10. A material layer stack for a pSTTM device, the material layer stack comprising:
    a magnetic tunnel junction (MTJ), the MTJ comprising:
      a fixed magnetic layer;
      a tunnel barrier disposed above the fixed magnetic layer;
      a first free magnetic layer disposed on the tunnel barrier;
      a coupling layer disposed above the first free magnetic layer;
      a second free magnetic layer disposed on the coupling layer;
      an oxide layer disposed on the second free magnetic layer;
      a non-magnetic protective layer disposed directly on the oxide layer, wherein the non-magnetic protective layer comprises cobalt and iron;
      a conductive capping layer disposed directly on the non-magnetic protective layer, the conductive capping layer having a low oxygen affinity;
    a bottom electrode layer disposed below the MTJ; and
    a top electrode layer disposed above the capping layer.

11. The material layer stack of claim 10, wherein the conductive capping layer is selected from the group consisting of molybdenum, ruthenium.

12. The material layer stack of claim 10, wherein the conductive capping layer has a thickness between 1.5 nm-5.0 nm.

13. The material layer stack of claim 10, wherein the non-magnetic protective layer further comprises boron.

14. The material layer stack of claim 10, wherein the non-magnetic protective layer has a thickness between 0.3 nm-1.5 nm.

15. The material layer stack of claim 10, wherein the oxide layer has a thickness that is less than the thickness of the tunnel barrier.

16. The material layer stack of claim 10, wherein the top electrode is a material different from the material of the capping layer.

17. The material layer stack of claim 10, wherein a synthetic antiferromagnetic layer is disposed between the fixed layer and the bottom electrode layer.

* * * * *